United States Patent
Pour

(10) Patent No.: US 6,335,564 B1
(45) Date of Patent: Jan. 1, 2002

(54) SINGLE PADDLE HAVING A SEMICONDUCTOR DEVICE AND A PASSIVE ELECTRONIC COMPONENT

(75) Inventor: Siamak Fazel Pour, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/083,474

(22) Filed: May 22, 1998

Related U.S. Application Data

(63) Continuation-in-part of application No. 09/073,779, filed on May 6, 1998.

(51) Int. Cl.$^7$ .................................................. H01L 23/495
(52) U.S. Cl. ........................... 257/666; 257/690; 257/676
(58) Field of Search .................................... 257/666, 676, 257/924; 251/690

(56) References Cited

U.S. PATENT DOCUMENTS

| | | |
|---|---|---|
| 5,103,283 A | 4/1992 | Hite |
| 5,294,897 A | 3/1994 | Notani et al. |
| 5,428,245 A * | 6/1995 | Lin et al. ...................... 257/924 |
| 5,442,228 A | 8/1995 | Pham et al. |
| 5,504,370 A | 4/1996 | Lin et al. |
| 6,034,423 A | 3/2000 | Mostafazadeh et al. |

FOREIGN PATENT DOCUMENTS

| WO | WO 96 08842 | 3/1996 |
|---|---|---|

OTHER PUBLICATIONS

Patent Abstracts of Japan, vol. 096, No. 004, Apr. 30, 1996 & JP 07 321069 A (NEC Corp.) Dec. 8, 1995.
Patent Abstracts of Japan, vol. 015, No. 405, Oct. 16, 1991 & JP 03 166756 A (Seiko Epson Corp.) Jul. 18, 1991.
Patent Abstracts of Japan, vol. 018, No. 617, Nov. 24, 1994 & JP 06 236959 A (Ibiden Co. Ltd.) Aug. 23, 1994.
Walter Marton, Ansgar Pottbäcker, "Coil in Leadframe," IEEE Workshop on Chip Package Co–Design CPD '98, ETH Zurich, Switzerland, Mar. 24, 1998.

* cited by examiner

Primary Examiner—Roy Potter
(74) Attorney, Agent, or Firm—Snell & Wilmer L.L.P.

(57) ABSTRACT

A semiconductor package and a corresponding method of forming this package are provided. The semiconductor package includes a paddle and a semiconductor device mounted on the paddle. A passive electronic component is also mounted on the paddle and spaced apart from the semiconductor device. Interconnects provide a conductive path from a bonding pad of the semiconductor device to a bonding pad of the passive electronic component such that the passive electronic component and semiconductor device are operatively connected.

16 Claims, 9 Drawing Sheets

SINGLE PADDLE HAVING A SEMICONDUCTOR DEVICE AND A PASSIVE ELECTRONIC COMPONENT

This is a continuation-in-part of application Ser. No. 09/073,779 filed on May 6, 1998, entitled "LEADFRAME HAVING A PADDLE WITH AN ISOLATED AREA."

BACKGROUND OF THE INVENTION

1. Field of the Invention

The present invention generally relates to semiconductor packaging, and more particularly to a single paddle having a semiconductor device and a passive component spaced apart from the semiconductor device and mounted within the single paddle.

2. Description of Related Art

The electronics industry has continued to make significant advances in microelectronics technology. These advances are producing silicon-based integrated circuits with increased circuit density and a corresponding rise in the rate at which functions are performed. However, as circuit density and speed are improved, corresponding progress must also be made in the structures that carry the device and that provide the input/output (I/O) interconnections for the device.

The structure that carries a semiconductor device and provides the necessary I/O interconnections is generally referred to as the package. A typical microelectronic package is designed to provide structure to support and protect the device, and to distribute circuit-generated heat. Furthermore, the package provides connections for signal lines leading into and out of the device, connections that present varying potentials for power and ground, and a wiring structure for I/O signal interconnections within a system. These connections must be made at each level of the packaging hierarchy and as this hierarchy is traversed (i.e., from the chip to the I/O components), connection scaling must be provided because the circuits and connections (i.e., wire lines) continue to increase in size. At the first level of the hierarchy (i.e., chip to substrate), this scaling is usually provided by the leadframe.

A plan view of a conventional leadframe 20 is shown in FIG. 1 and a cross-sectional view of leadframe 20 taken along lines 2—2 of FIG. 1 is presented in FIG. 2. Leadframe 20 has a leadframe body 22 that contains a die-mounting structure 24. Die-mounting structure 24 is typically formed through an etching or stamping process, and leadframe 20 is usually made of a metal, such as copper (Cu) or a metal alloy.

Die-mounting structure 24 has a square die-pad or paddle 26 for receiving a semiconductor chip 28 that may be adhesively or metallurgically bonded thereon, and four structural supports 30,32,34,36. Each of the structural supports 30,32,34,36 extends from a corner of paddle 26 to mechanically connect panel 26 to leadframe body 22.

Die-mounting structure 24 also has numerous leads 38,40 that provide scaled connections from chip 28 to the next level of the package. Leads 38,40 are commonly connected to chip 28 using a process known as wire bonding. This process consists of attaching flexible wires 42,44 between chip bonding pads 46,48 and lead posts 50,52, or alternatively, between chip bonding pads 46,48 and paddle 26.

Currently, 25% to 40% of the leads are assigned to different ground and power supply nets. Therefore, power supply and ground contacts contribute substantially to package cost, size, and performance. Furthermore, path inductance from the chip to the outside of the package, which is directly proportional to the path length from the bond pads of the chip to the bond pads of the leads, may negatively impact chip performance, especially for digital/mixed signal and Radio Frequency (RF) chips. While a leadframe based package with a low inductive path is currently available in a deep down-set paddle package, only a single low inductive path is provided and is typically used for ground.

An additional packaging limitation is the inability to effectively integrate passive components that are necessary for proper operation of a semiconductor device. Currently, these components are integrally formed as a part of the semiconductor device are formed and packaged as independent units as shown in FIG. 3 and FIG. 4.

Referring to FIG. 3 and FIG. 4, a semiconductor package 300 of the prior art is shown that utilizes a first paddle area 302 for a semiconductor device 304 and a second paddle area 306 for an off-chip component 308 (e.g., an inductor, capacitor, transformer, etc.). Semiconductor device 304 is connected to off-chip component 308 through leads 310,312 that are structurally supported with an adhesive tape. This configuration, however, increases overall package size and path inductance between off-chip component 308 and semiconductor device 304 since the conductive path that forms the electrical connection includes: the distance between device 304 and leads 310,312; the length of leads 310,312; and the distance between leads 310,312 and component 308. Even if the distance between off-chip component 308 and semiconductor device 304 is optimized by including the component as a part of the semiconductor device (i.e, on-board the chip), limits are still encountered that impede optimal performance.

For example, on-chip inductors are usually limited to low Q values (i.e., typically less than 5). Furthermore, on-chip inductors tend to couple noise through the substrate and formation at the substrate requires a thick metal layer (i.e., usually greater than 2 microns) which consumes a significant area of the chip. This reduces chip yield while increasing chip cost. As inductors with values ranging from 1.5 nH to 15 nH and having a Q value greater than 20 are used in somponents such as Voltage Controlled Oscillators (VCO), input and output matching of Low Noise Amplifiers (LNA), output matching RF circuit mixers, and gain adjustment circuits, effective integration into a microelectronic package is highly desirable.

In view of the foregoing, it is an object of the present invention to provide a semiconductor package that incorporates passive electronic components used by a semiconductor device while reducing path inductance and minimizing any increase in the overall size of the package. Additional advantages and features of the present invention will become apparent from the subsequent description and claims taken in conjunction with the accompanying drawings.

SUMMARY OF THE INVENTION

A semiconductor package is provided that includes a paddle and a semiconductor device mounted on the paddle. A passive electronic component is also mounted on the paddle and spaced apart from the semiconductor device. Interconnects provide a conductive path from a bonding pad of the semiconductor device to a bonding pad of the passive electronic component such that the passive electronic component and semiconductor device are operatively connected.

A method of forming a semiconductor package is also provided that includes identifying a paddle region within a leadframe and mounting a semiconductor device within the paddle region. A passive electronic component is selected for use by the semiconductor device and the passive electronic device is mounted spatially apart from the semiconductor device and within the paddle region.

Additional advantages and features of the present invention will become apparent from the subsequent description and claims taken in conjunction with the accompanying drawings.

BRIEF DESCRIPTION OF THE DRAWINGS

Other advantages of the invention will become apparent upon reading the following detailed description and upon reference to the following drawings, in which.

DESCRIPTION OF THE PREFERRED EMBODIMENTS

The following descriptions of preferred embodiments are exemplary in nature and are not intended to limit the invention or its application or uses.

ELECTRICALLY ISOLATED REGION WITHIN THE PADDLE

Figure 1:
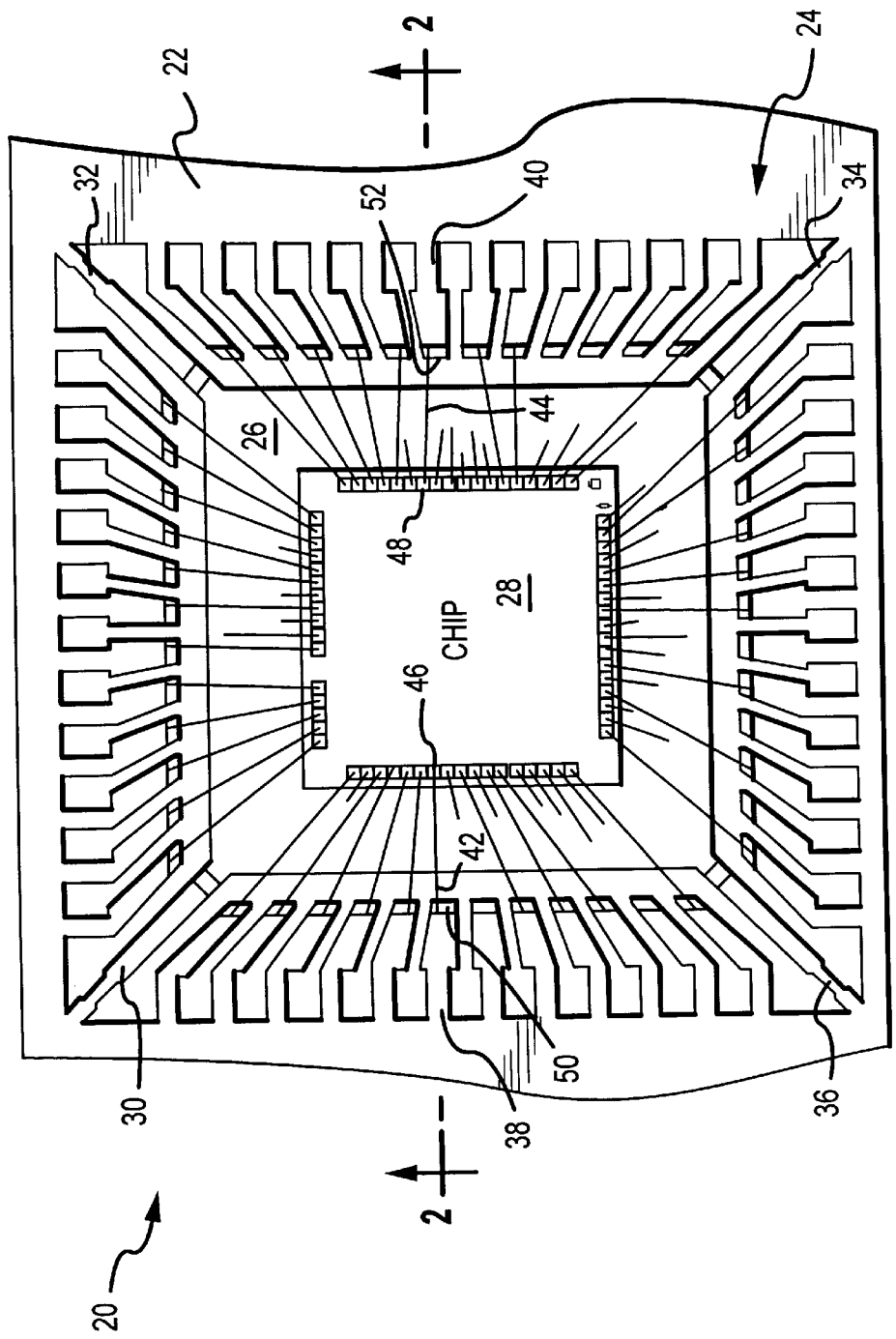
FIG. 1 is a plan view of a prior art leadframe.
Figure 2:
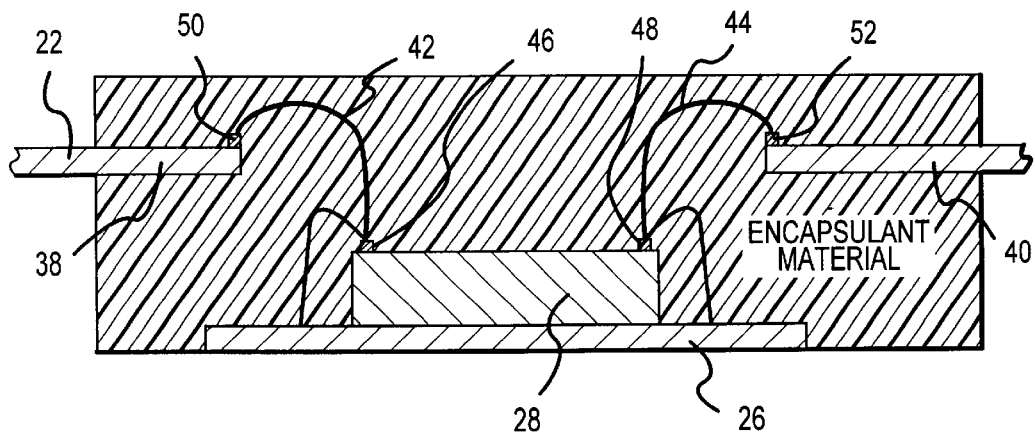
FIG. 2 is a cross-sectional view of the prior art leadframe of FIG. 1 taken along lines 2—2.
Figure 6:
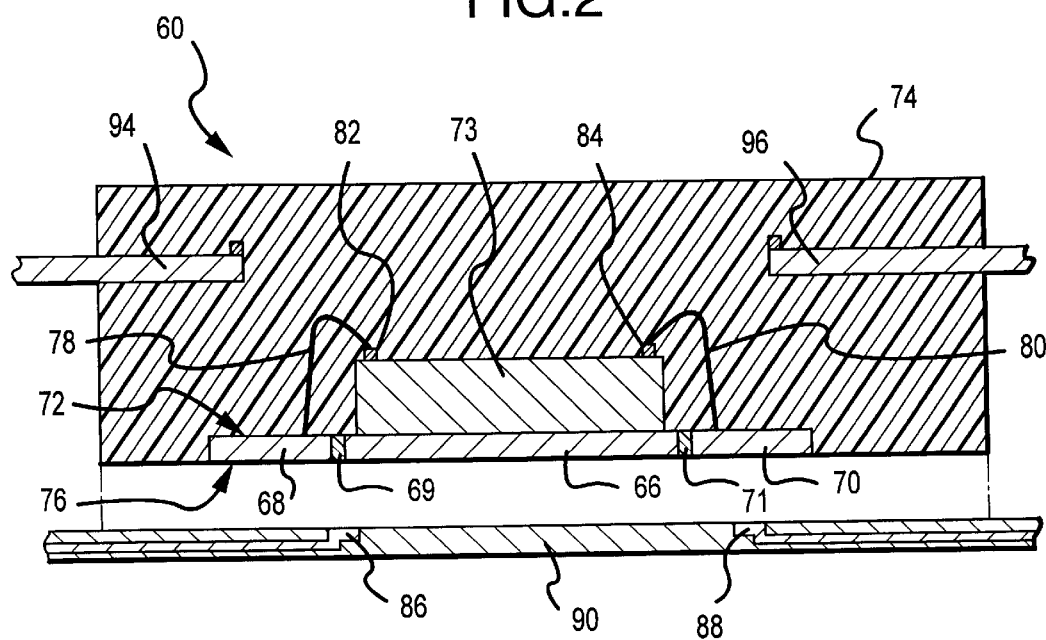
FIG. 6 is a cross-sectional view of the leadframe of FIG. 5 taken along lines 6—6.
Figure 3:
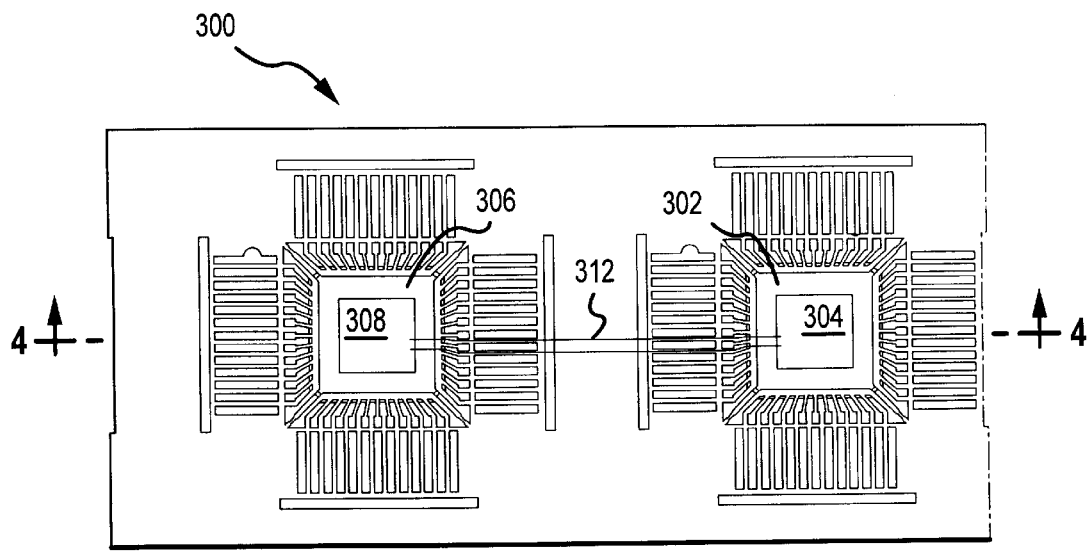
FIG. 3 is a plan view of a prior art semiconductor package that utilizes multiple paddles areas when a off-device passive component is desired.
Figure 4:
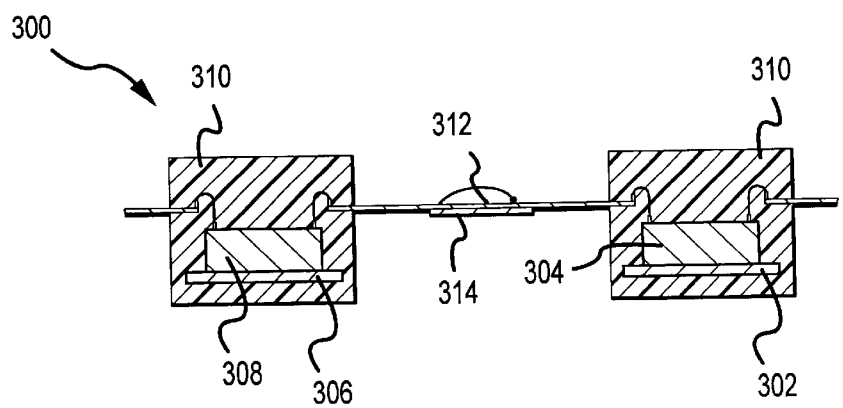
FIG. 4 is a cross-sectional view of the prior art semiconductor package of FIG. 3 taken along lines 4—4.
Figure 5:
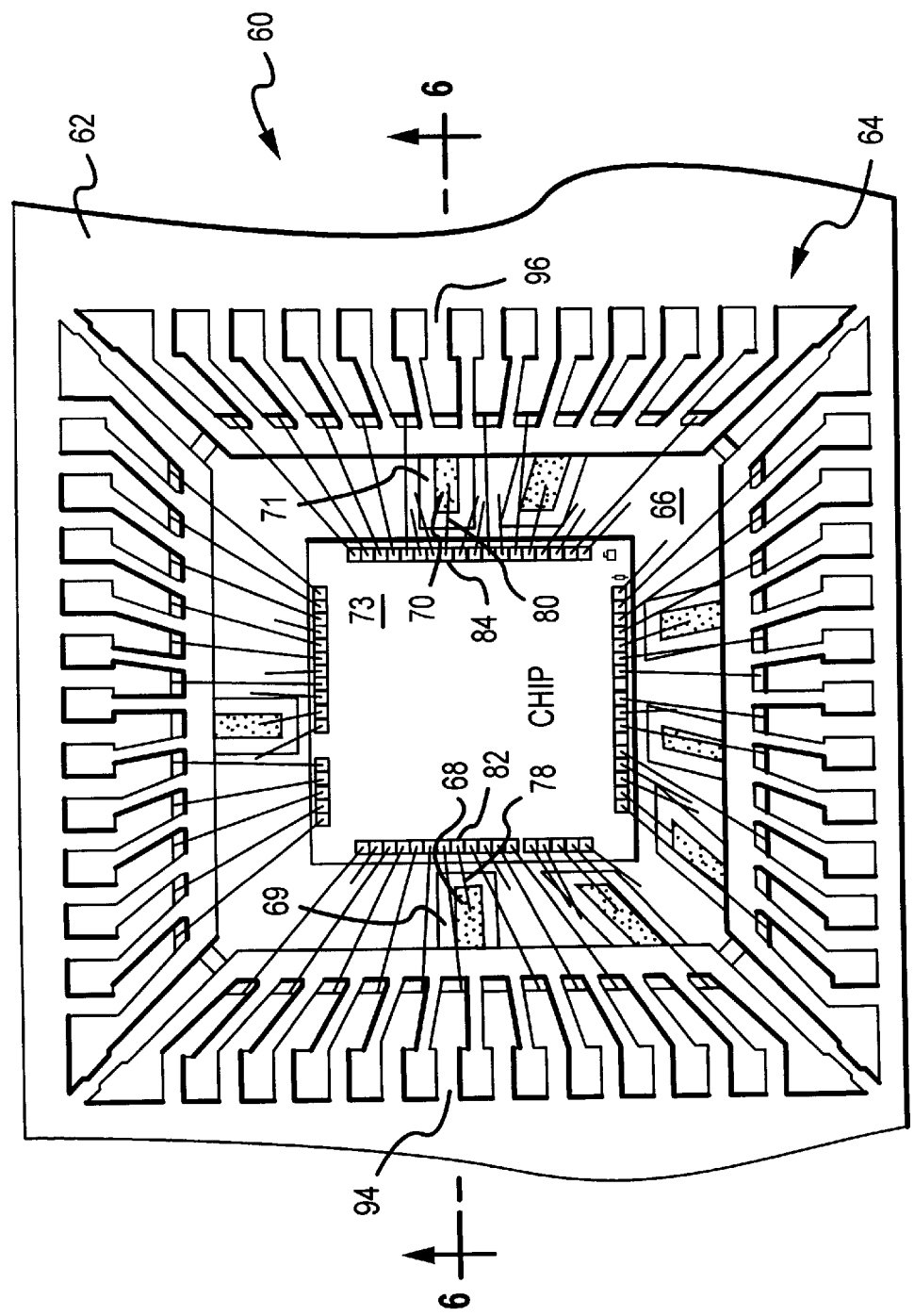
FIG. 5 is a plan view of a leadframe having an electrically isolated area.

A plan view of a leadframe 60 is shown in FIG. 5 and a cross-sectional view of leadframe 60 taken along lines 6—6 of FIG. 5 is presented in FIG. 6. Leadframe 60 has a leadframe body 62 that contains a die-mounting structure 64. Die-mounting structure 64 has a square die-pad or paddle area 66 containing a number of regions 68,70 that are electrically isolated by path gaps 69, 71. While multiple isolated areas are shown in FIG. 5, description will be limited to regions 69,71.

The top side 72 of paddle area 66 receives a semiconductor device 73 that may be adhesively or metallurgically bonded thereon. Furthermore, the top side 72 is at least partially enclosed by an encapsulant material 74 while the backside 76 of the paddle area 66 is substantially exposed. Wires 78,80 are connected to the bond pads 82,84 of the semiconductor device 73 and bonded (e.g., down-bonded) to the regions 68,70. In this way, a conductive path is formed between bond pads 82,84 of semiconductor device 73, regions 68,70, and bond pads 86,88 of a board 90 (FIG. 6) when backside 76 of paddle area 66 is mated to board 90.

Bond pads 86,88 of board 90 may be power contacts, ground contacts, or I/O interconnections. Therefore, leads 94,96 of the leadframe 60 may be reduced as conductive paths through leads 94,96 are provided by electrically isolated regions 68,70 within paddle area 66. Furthermore, as the distance between semiconductor device 73 and paddle area 66 is typically less than the distance from semiconductor device 73 to leads 94,96, path inductance is also reduced since it is directly proportional to length.

Figure 7:
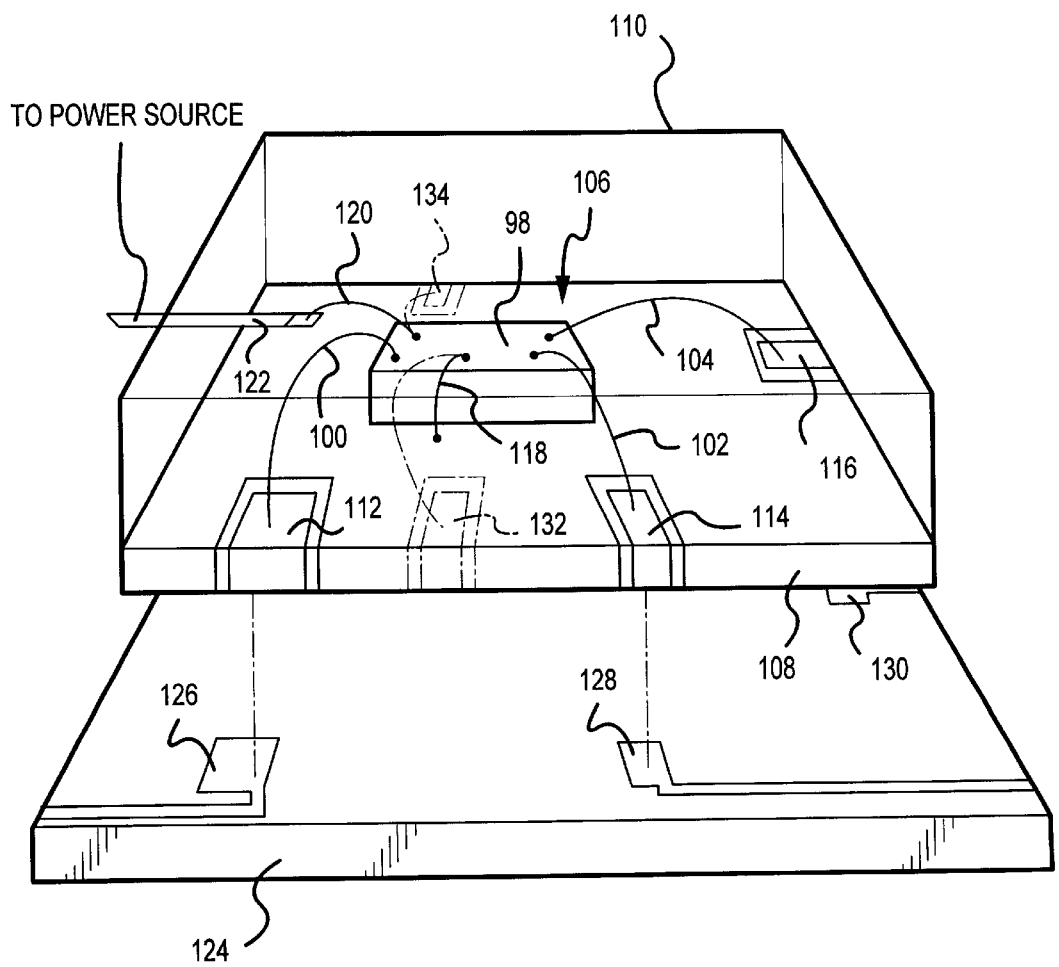
FIG. 7 is perspective view semiconductor device that is interconnected to a motherboard through multiple isolated regions within a paddle.

In order to demonstrate the wide scope of this invention, the following description is presented in conjunction with FIG. 7. As can be seen, a semiconductor device 98 (e.g., Bipolar Junction Transistor (BJT)) having three terminals 100,102,104 (e.g., base, emitter, and collector) is packaged according to the present invention. The semiconductor device 98 is mounted on the top side 106 of a paddle 108 and at least partially covered with an encapsulant material 110. Each of the three terminals 100,102,104 is connected to one of three isolated regions 112,114,116 within the paddle 108. The device ground terminal 118 is connected to the paddle 108 and the device power terminal 120 is connected to a single lead 122. Therefore, the three terminals 100,102,104 are provided with a conductive path to a board 124 having pads 126,128,130 for each of the isolated regions 112,114, 116. Alternatively, two additional isolated regions 132,134 may be provided within the paddle 108 for the device ground terminal 118 and the device power terminal 120. Irrespective of the configuration used, the number of leads is reduced and the connection distances are minimized, thereby reducing package cost, size, and path inductance.

Figure 8:
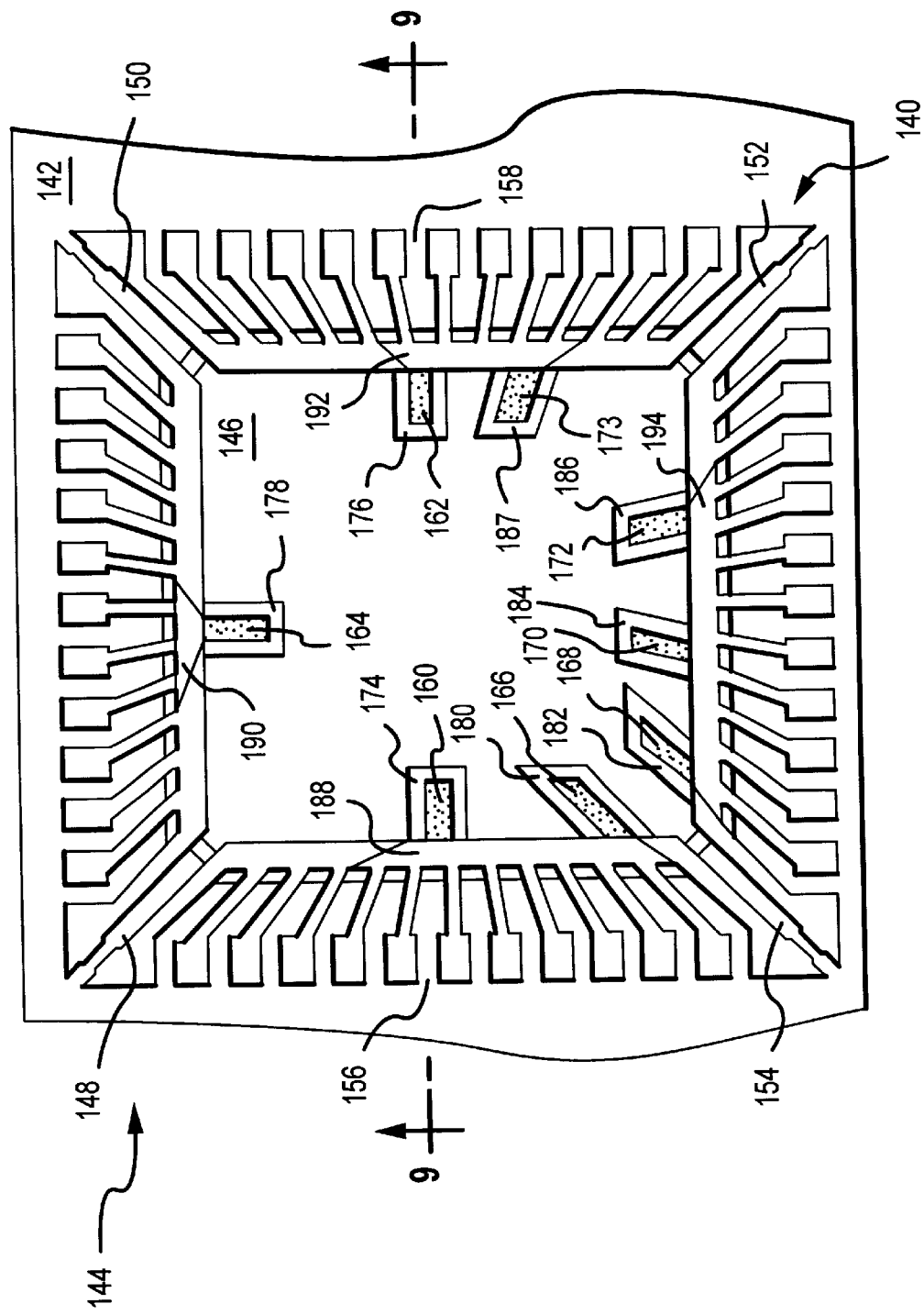
FIG. 8 is a plan view of a leadframe having multiple electrically isolated areas within the paddle.

In order to produce the leadframe of the preferred embodiment, a unique method of forming an isolated region in a paddle of a leadframe has been developed. Referring to FIG. 8, a die-mounting structure 140 is shown that is contained within a leadframe body 142 of a leadframe 144. Initially, a resist is deposited on the leadframe body 142 in a pattern that defines the basic features of the leadframe 144. These basic features include, but are not limited to, the paddle 146, structural supports 148,150,152,154, and multiple leads 156,158.

In addition to the basic features, a number of isolation regions 160,162,164,166,168,170,172,173 are defined within the paddle 146, path gaps 174,176,178,180,182,184, 186,187 are defined around each of the isolated regions 160,612,164,166,168,170,172,173, and a number of support regions 188,190,192,194 are defined within the leadframe 142. Once these patterns have been defined, leadframe body 142 is etched using known dry etching or wet etching techniques. The base material of leadframe body 142 is removed such that the basic features remain.

In addition, the base material is substantially removed from path gaps 174,176,178, 180,182,184,186,187 but remains in support regions 188,190,192,194 so that isolation regions 160,162, 164,166,168,170,172,173 are connected to the leads and structurally supported. It should be understood that the features may also be created using known punching techniques in which resist deposition is not required.

Once the etching is complete, an adhesive tape (not shown) is applied to the bottom surface of the leadframe body 142 to provide additional structural support. For example, a one-sided adhesive claded polyimid tape may be used. This is followed by disconnecting the support regions from the leads and isolation using known free cutting techniques.

Figure 9:
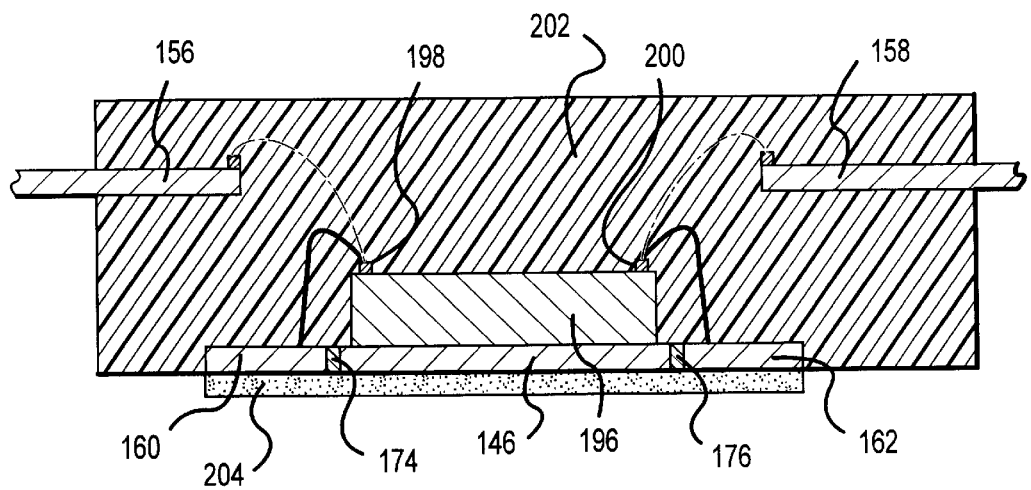
FIG. 9 is a cross-sectional view of the leadframe of FIG. 8 taken along lines 8—8.

Continuing with FIG. 9, once the isolation regions have been separated from the leads, the paddle 146 is deep down-set. It should be noted that although deep down-setting is not required, a deep down-set package is shown in this description. After the leadframe is properly configured, a semiconductor device 196 is adhesively or metallurgically bonded to paddle 146, and each of the bond pads 198,200 of the device 196 is down-bonded to an isolated region 160, 162, or alternatively, bonded to a lead 156,158. Next, semiconductor device 196, paddle 146 (including isolation regions 160,162), and portions of the leads 156,158 are covered with an encapsulant material 202. Lastly, as the encapsulant material 202 is supporting the isolation regions 160,162, the adhesive tape 204 may be removed.

An alternate method of forming an isolation region in a paddle leadframe involves laser assisted etching. This is particularly useful for packages having a deep down-set and exposed paddle. While the previously described method involves steps integrated into the basic formation process of a deep down-set package, the alternate method forms the isolation region(s) once the basic formation process is substantially completed. More specifically, once the paddle is down-set and the encapsulant material is applied, an excimer or solid state laser is used to create the path gaps from the exposed side of the paddle (i.e., the excimer or solid state laser is directed at the backside of the paddle). As the encapsulant material is present on the front side o f the paddle, the isolation regions are structurally supported when the base material is removed by the laser. Typically, an excimer laser having a power setting of 30–50 watts with a pulse width of approximately 20 ns is used, resulting in an etch rate of about 0.1 microns per pulse.

These methods provide a package that may be surface mounted to a mother board such that selected chip bond pads may be connected to the board bond pads through isolation regions within the paddle. These isolation regions may provide connections for power contacts, ground contacts, and/or I/O signal connections. Alternatively, the isolation regions may be configured to contain an electrical component.

As previously alluded, inclusion of electrical components within the semiconductor chip may be undesirable. This is especially true with components that require a significant amount of area within a chip (i.e., inductors). Therefore, if an isolation area within the paddle is configured to contain such a component, an offchip solution would be provided that does not increase the overall size of the package.

Figure 10:
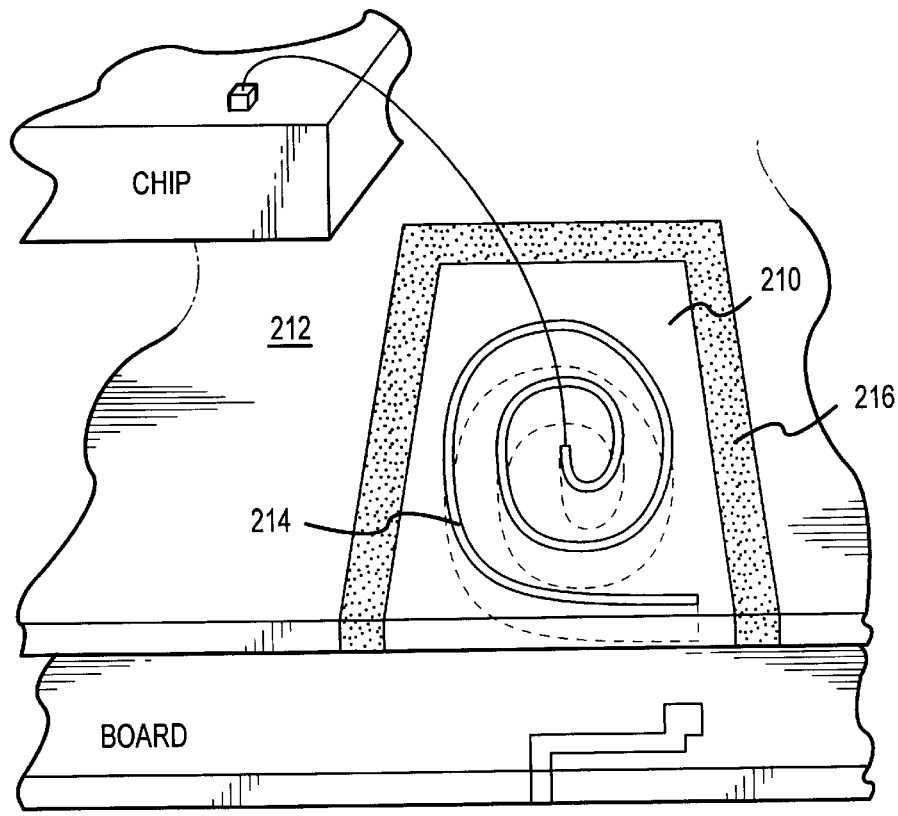
FIG. 10 is plan view of an isolated region of a paddle that contains an off-chip spiral inductor.

As can be seen in FIG. 10, the isolation region 210 created within a paddle 212 could have the form of a spiral inductor 214, and may be realized using the processes previously described. Specifically, inductor 214 is attached to the support regions (not shown) to hold inductor 214 after the creation of a path gap 216. After tape (not shown) is attached the backside of paddle 212, the support regions may be removed as the tape provides the structural support for inductor 214. Once an encapsulant material covers the front side of the paddle, the tape may be removed. Alternatively, the package may be formed and the spiral inductor may be etched from the backside using the excimer or solid state laser as previously discussed.

In any event, the inductor is isolated from the paddle 212 and formed out of the base material of the paddle 212.

Hence, the inductor 214 thickness corresponds to the thickness of the paddle 212, which is typically 100 to 150 microns. This is 50 to 100 times the thickness of the metal layer previously utilized on the chip and, because the leadframe material is often copper, the conductivity is approximately 1.8 times that of aluminum, which is generally used as the metal material in the chip. As this inductor 214 has a greater conductivity and a correspondingly higher Q value (i.e, Q is directly proportional to the conductivity of the inductor), a high Q inductor is effectively integrated into the package without significantly increasing the overall size of the package.

PASSIVE ELECTRONIC COMPONENT WITHIN THE PADDLE

Figure 11:
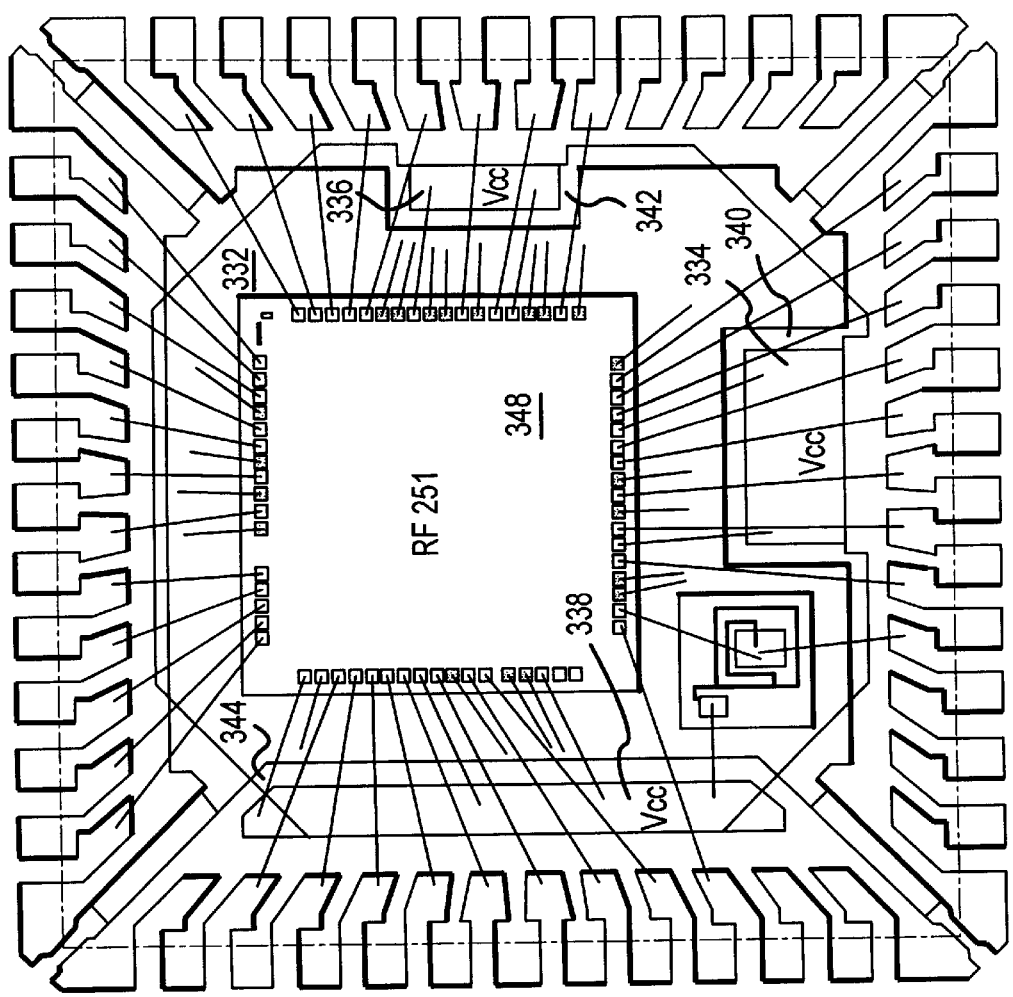
FIG. 11 is a plan view of a leadframe having a paddle with a semiconductor device and a passive electronic component spaced apart from the semiconductor device and mounted within the paddle.
Figure 12:
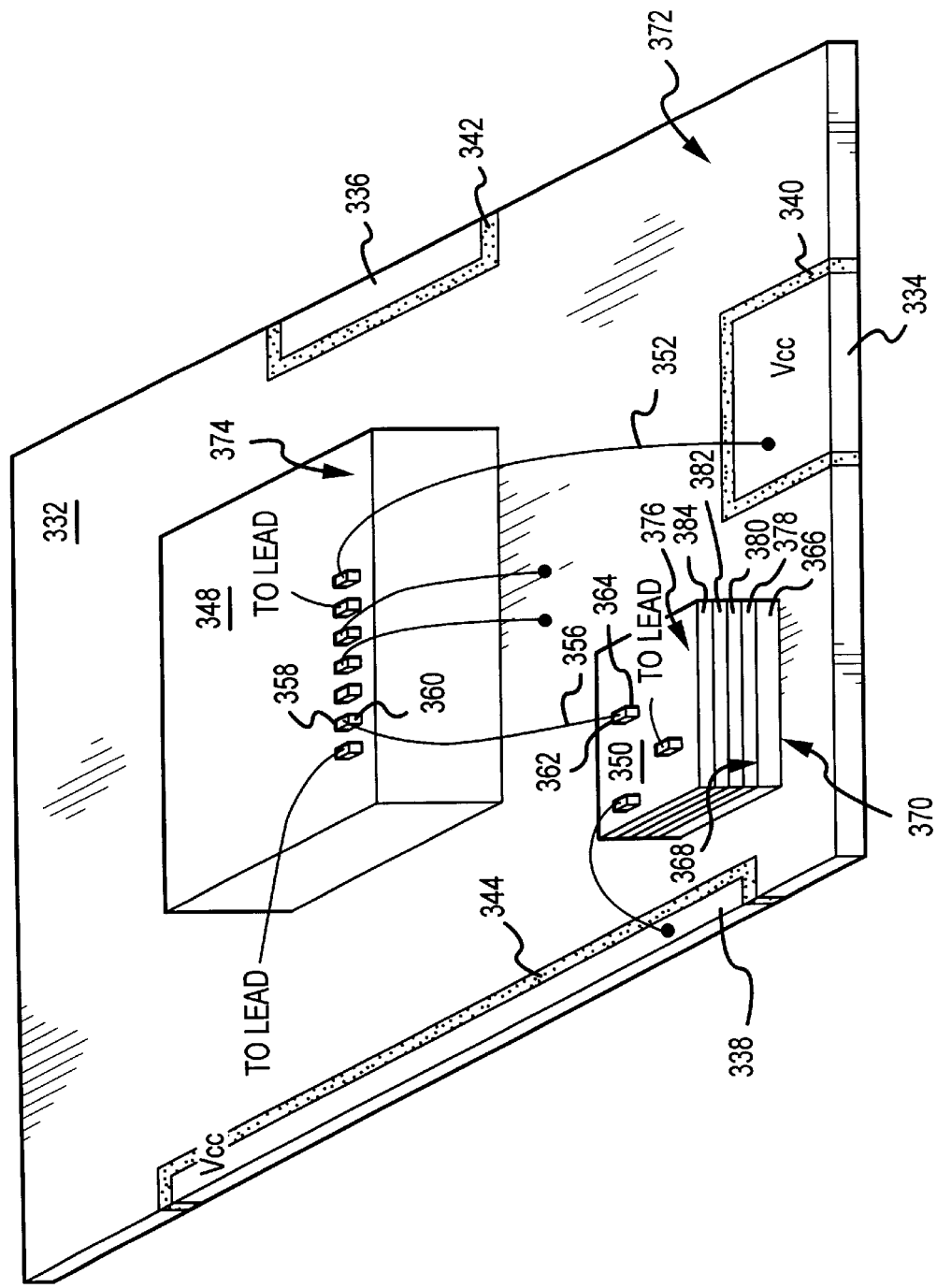
FIG. 12 is an isometric view of the leadframe of FIG. 11.

An alternate package that effectively integrates a high Q inductor, or any other passive component, and a semiconductor device is shown in FIGS. 11 and 12. For sake of clarity, not all of the wire bonds, leads, bond pads, etc. of FIG. 11 are shown in FIG. 12. Leadframe 330 (not shown in FIG. 12) has a square die-pad or paddle 332 and a number of regions 334,336,338 that are electrically isolated by path gaps 342,344,346 as previously described. The paddle 332 receives a semiconductor device 348 and a passive component 350 that is spaced apart from the semiconductor device 348. In this illustrative description, the passive component 350 is a transformer. However, it should be understood that this package configuration may be used to integrate other multiple devices that currently exist or will be developed. Furthermore, as can be appreciated from the previous description, use of isolation region(s) within the paddle provides significant advantages. While these regions 334, 336,338 are utilized in conjunction with the passive component 350 and semiconductor device 348 to provide a package that incorporates many of the new and useful features as described herein, integration of the passive component 350 and semiconductor device 348 onto a single paddle 332 also provides significant improvements and capabilities in and of itself.

Continuing to refer to FIG. 11 and FIG. 12, in addition to the conductive paths created with interconnects 352 or wires formed between the semiconductor device 348, the regions 334,336,338, and the leads (not shown in FIG. 12), a conductive path is formed between the passive component 350 and the semiconductor device 348. The path consists of an interconnect 356 having a first end 358 attached to a bond pad 360 of the semiconductor device 348, and a second end 362 attached to a bond pad 364 of the passive component 350.

Passive device 350 includes multiple conductive and isolation layers. These layers are built upon a ceramic substrate 366 (e.g., an alumina $Al_2O_3$ substrate) that has a top side 368 and bottom side 370. The bottom side 370 is adhesively or metallurgically bonded to the paddle 332, and the top side 368 receives additional conductive and/or insulation layers as will be subsequently described.

The vertical height of ceramic tile 366 (i.e., the distance between top side 368 and bottom side 370 ) may be adjusted such that once the conductive and/or insulation layers have been deposited, the vertical height from the top side of the paddle 372 to the top side of the semiconductor device 374 will be approximately the same as the vertical height from the top side of the paddle 372 to the top side of the semiconductor device 376. In this way, the distance between bond pad 360 of semiconductor device 348 and bond pad 364 of passive component 350 is kept to a minimum.

As previously indicated, passive component 350 is described with reference to a transformer. Therefore, up to five layers are placed on top side 368 of ceramic substrate 366. Specifically, a first conductive layer 378 (e.g, a layer of metal such as copper (Cu)), a first insolation layer 380 (e.g., an organic polymer such as polyimid, polybenzoxazol (PBO), benzocyclobuten (BCB)), a second conductive layer 382, and a second isolation layer 384 are deposited. The first conductive layer 378 and second conductive layer 380 are etched to produce spiral inductors having desired windings, thicknesses, etc.; and the thickness of first isolation layer 380 is set in order to provide a separation between the inductor in the first conductive layer 378 and the inductor in the second conductive layer 380 such that a transformer with the desired characteristics is produced. It should be readily apparent that a transformer is only one example of many components that could be spaced apart from semiconductor device 348 and mounted on paddle 332. Additional components include, but are not limited to, capacitors and inductors. For example, a capacitor can be realized by directly bonding a first conductive layer to the paddle that has an first insolation layer and second conductive layer formed thereon. Therefore, two substantially parallel plates are separated and a capacitor is created as a part of a semiconductor package without increasing the overall package size.

A method by which a multi-layer passive electronic component (e.g., transformer) may be formed is as follows. Initially, a ceramic substrate is selected as a base. Once the ceramic has been chosen, the first conductive layer (e.g., metal such as copper (Cu)) is sputtered on the ceramic. The first conductive layer is then patterned using known photolithography processes, and etched using dry or wet techniques such that portions of the first conductive layer are removed to form a first inductor. The first isolation layer is applied using a known spin-off procedure which provides a specified thickness based upon rate of rotation. The second conductive layer is then sputtered on to the first isolation layer, patterned, and etched as previously described to form a second inductor. Next, the second isolation layer is applied with the spin-off procedure. Lastly, bond pads are formed as required using known techniques and the passive electronic component is available for incorporation into a semiconductor package.

The overall semiconductor package is formed in the following manner. First, a paddle region within a lead frame is identified. This is followed by mounting (e.g., die-bonding) a semiconductor device within the paddle region and selecting a passive electronic component that will be utilized by the semiconductor device. Once the passive electronic component is selected, it is mounted (e.g., die-bonded) such that it is spaced from the semiconductor device but within the paddle region. Once the passive electronic component is properly mounted, the interconnections between the semiconductor device, electronic component, leads, paddle, and isolation regions are created (e.g., by wire bonding). Lastly, an encapsulant is deposited over the paddle such that the passive electronic component and semiconductor device are substantially covered.

From the foregoing, it can be seen that a semiconductor package is provided which reduces path inductance without increasing the overall size of the package. Those skilled in the art can appreciate from this description that the broad teachings of the present invention can be implemented in a variety of forms. Therefore, modifications within the scope of the invention will become apparent to the skilled practitioner upon study of the drawings, specification, and following claims.

What is claimed is:

1. A semiconductor package, comprising:
   a leadframe comprising a plurality of finger-like members bounding a paddle area, wherein said finger-like members have conductive contacts;
   a conductive paddle located in said paddle area;
   a semiconductor device mounted on said paddle; and
   a passive electronic component spaced apart from said semiconductor device and mounted on said conductive paddle, wherein
   said passive electronic component includes a ceramic having a first side and a second side, said first side being bonded to said conductive paddle and said second side having a first conductive layer formed thereon.

2. The semiconductor package of claim 1, wherein said passive electronic component includes a first isolation layer deposited on said first conductive layer.

3. The semiconductor package of claim 2, wherein said passive electronic component includes a second conductive layer deposited on said first isolation layer.

4. The semiconductor package of claim 3, wherein said passive electronic component includes a second isolation layer deposited on said second conductive layer.

5. A semiconductor package, comprising:
   a leadframe comprising a plurality of finger-like members bounding a paddle area, wherein said finger-like members have conductive contacts;
   a conductive paddle located in said paddle area;
   a semiconductor device mounted on said paddle; and
   a capacitor spaced apart from said semiconductor device and mounted on said conductive paddle.

6. The semiconductor package of claim 1, further comprising an interconnect providing a conductive path from a bonding pad of said semiconductor device to a bonding pad of said passive electronic component.

7. The semiconductor package of claim 1, further comprising an electrically isolated region within said paddle.

8. The semiconductor package of claim 1, further comprising an interconnect providing a conductive path from said electrically isolated region to a bonding pad of said passive electronic component.

9. The semiconductor package of claim 1, wherein said passive electronic component includes:
   a first conductive layer having a first side and a second side, said first side of said first conductive layer being bonded to said paddle;
   a first isolation layer bonded to said second side of said first conductor; and
   a second conductive layer bonded to said first isolation layer.

10. The semiconductor package of claim 1, wherein said passive electronic component is an inductor.

11. The semiconductor package of claim 1, wherein said passive electronic component is a transformer.

12. A semiconductor package, comprising:
   a leadframe comprising a plurality of finger-like members bounding a paddle area, wherein said finger-like members have conductive contacts and said paddle area is deep-down set;
   a conductive paddle located in said paddle area;
   a semiconductor device mounted on said paddle; and
   a passive electronic component spaced apart from said semiconductor device and mounted on said conductive paddle.

13. The semi-conductor package of claim 12, further comprising an interconnect providing a conductive path from a bonding pad of said semiconductor device to a bonding pad of said passive electronic component.

14. The semiconductor package of claim 12, further comprising an electrically isolated region within said paddle.

15. The semiconductor package of claim 14, further comprising an interconnect providing a conductive path from said electrically isolated region to a bonding pad of said passive electronic component.

16. The semiconductor package of claim 12 wherein said paddle area has a front side and a back side, said front side being mated to the semiconductor device and said backside being at least partially exposed.

* * * * *